US010615112B2

(12) United States Patent
Li et al.

(10) Patent No.: US 10,615,112 B2
(45) Date of Patent: Apr. 7, 2020

(54) MIM CAPACITOR FOR IMPROVED PROCESS DEFECT TOLERANCE

(71) Applicant: International Business Machines Corporation, Armonk, NY (US)

(72) Inventors: Baozhen Li, South Burlington, VT (US); Chih-Chao Yang, Glenmont, NY (US); Andrew Tae Kim, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/970,601

(22) Filed: May 3, 2018

(65) Prior Publication Data

US 2019/0341347 A1 Nov. 7, 2019

(51) Int. Cl.
*H01L 49/02* (2006.01)
*H01L 23/522* (2006.01)
*H01L 21/768* (2006.01)
*H01L 23/525* (2006.01)
*H01L 23/532* (2006.01)

(52) U.S. Cl.
CPC .... *H01L 23/5223* (2013.01); *H01L 21/76895* (2013.01); *H01L 23/5256* (2013.01); *H01L 23/5329* (2013.01); *H01L 28/40* (2013.01)

(58) Field of Classification Search
CPC ............. H01L 23/5223; H01L 23/5256; H01L 23/5329; H01L 28/40; H01L 21/56795
See application file for complete search history.

(56) References Cited

U.S. PATENT DOCUMENTS

| 7,956,400 | B2 | 6/2011 | Smith | |
|---|---|---|---|---|
| 9,385,079 | B2 | 7/2016 | Chang et al. | |
| 9,627,312 | B2 | 4/2017 | Childs et al. | |
| 9,704,796 | B1 * | 7/2017 | Gu | H01L 24/17 |
| 9,761,655 | B1 * | 9/2017 | Ando | H01L 28/75 |
| 2004/0104420 | A1 | 6/2004 | Coolbaugh et al. | |

(Continued)

FOREIGN PATENT DOCUMENTS

KR 2017084617 * 7/2017

OTHER PUBLICATIONS

Mott, N. F., "Metal-insulator transition in Ti2O3", J. Physique, Feb. 1981, pp. 277-281, 42.

(Continued)

*Primary Examiner* — Ahmed N Sefer
(74) *Attorney, Agent, or Firm* — Scully, Scott, Murphy & Presser, P.C.; Alvin Borromeo, Esq.

(57) ABSTRACT

A method and structure to isolate BEOL MIM capacitors shorted or rendered highly leaky due to in process, or service induced defects, in a semiconductor chip are provided such that the rejection and loss of yield of otherwise good chips is minimized. In one embodiment, the method incorporates an isolation element such as, for example, a fuse, or a phase change material such as, a metal/insulation transition metal material, in series between the MIM capacitor and the active circuit. When a high current passes through the element due to the MIM capacitor being defective, the isolation element is rendered highly resistive or electrically open thereby disconnecting the defective capacitor or electrode plate from the active circuitry.

11 Claims, 7 Drawing Sheets

(56) References Cited

U.S. PATENT DOCUMENTS

| | | |
|---|---|---|
| 2004/0197991 A1* | 10/2004 | Lee .................. H01L 21/76807 |
| | | 438/253 |
| 2007/0166911 A1* | 7/2007 | Lo ....................... H01L 21/0337 |
| | | 438/238 |
| 2010/0148304 A1 | 6/2010 | Rahim et al. |
| 2010/0224960 A1* | 9/2010 | Fischer ............... H01L 23/5223 |
| | | 257/532 |
| 2011/0051304 A1 | 3/2011 | Venkatraman et al. |
| 2013/0270675 A1* | 10/2013 | Childs ................ H01L 23/5226 |
| | | 257/532 |
| 2014/0159200 A1* | 6/2014 | Loke .................. H01L 23/5223 |
| | | 257/532 |
| 2014/0265632 A1 | 9/2014 | Wang et al. |
| 2015/0162397 A1 | 6/2015 | Chiou et al. |
| 2016/0104762 A1* | 4/2016 | Triyoso ................... H01L 28/60 |
| | | 257/532 |
| 2016/0315050 A1 | 10/2016 | Chang et al. |
| 2017/0040411 A1* | 2/2017 | Kawa ....................... H01L 28/60 |
| 2017/0162105 A1* | 6/2017 | Kim ...................... G09G 3/2092 |
| 2019/0013269 A1* | 1/2019 | Zhang ................ H01L 23/5223 |

OTHER PUBLICATIONS

Vaidyanathan, K., et al., "Overcoming Interconnect Scaling Challenges Using Novel Process and Design Solutions to Improve Both High-Speed and Low-Power Computing Modes", Electron Devices Meeting (IEDM), 2017 IEEE International, Date of Conference: Dec. 2-6, 2017, 4 pages.

* cited by examiner

MIM CAPACITOR FOR IMPROVED PROCESS DEFECT TOLERANCE

BACKGROUND

The present application relates to an integrated circuit (IC) chip and a method of forming the same. More particularly, the present application relates to an IC chip including a back-end-of-the-line (BEOL) metal-insulator-metal (MIM) capacitor in which an isolation element is present that can disconnect the BEOL MIM capacitor or electrode plate from active circuitry if the BEOL MIM capacitor becomes defective.

On-chip capacitors including metal-insulator-metal (MIM) capacitors are essential for many semiconductor chips. For example, MIM capacitors are frequently utilized as decoupling capacitors for mitigating power supply or switching noise caused by changes in current flowing in an integrated chip. MIM capacitors are often integrated into a back-end-of-the-line (BEOL) metallization stack, at a position between an underlying first metallization layer and an overlying second metallization layer. When integrated, a MIM capacitor is commonly formed as a stacked structure including planar electrode plates.

For a high performance semiconductor chip, most of the chip area may be covered by MIM capacitors. The defect density for the MIM capacitors needs to be very low due to large total area that the MIM capacitors occupy on a chip. The MIM capacitor is principally a very cheap element, but if the MIM capacitor causes chip yield loss or early fails due to defects, the overall cost of the chip will increase. There is thus a need to provide a method to minimize the defective MIM capacitor impact on chip yield and lifetime.

SUMMARY

A method and structure to isolate BEOL MIM capacitors shorted or rendered highly leaky due to in process, or service induced defects, in a semiconductor chip are provided such that the rejection and loss of yield of otherwise good chips is minimized. In one embodiment, the method incorporates an isolation element such as, for example, a fuse, or a phase change material such as, a metal/insulation transition metal material, in series between the MIM capacitor and the active circuit. When a high current passes through the element due to the MIM capacitor being defective, the isolation element is rendered highly resistive or electrically open thereby disconnecting the defective capacitor or electrode plate from the active circuitry. The method may include the thermal and electrical modeling of such elements to enable optimal design and placement of such elements in an integral fashion within the BEOL MIM capacitors, and large area MIM capacitor arrays to enable selective isolation of defective MIM capacitors.

In one aspect of the present application, an integrated circuit (IC) chip is provided. In one embodiment, the IC chip includes an interconnect level including a plurality of electrically conductive structures embedded in an interconnect dielectric material layer. A via interlayer dielectric (ILD) material is located above the interconnect level. A metal-insulator-metal (MIM) capacitor is embedded in the via ILD material and includes a stack of a first electrode, a first capacitor dielectric material layer and a second electrode, wherein an isolation element is located between segments of at least one of the first and second electrodes. Metal or metal alloy contact structures are located in the via ILD material, wherein each metal or metal alloy contact structure extends to a surface of one of the electrically conductive structures present in the interconnect dielectric material layer.

In another embodiment, the integrated circuit chip includes a plurality of metal-insulator-metal (MIM) capacitors embedded in the via ILD material, wherein each MIM capacitor comprises a stack of a first electrode, a first capacitor dielectric material layer and a second electrode, wherein an isolation element is located between segments of at least one of the first and second electrodes.

In another aspect of the present application, a method of forming an integrated circuit (IC) chip is provided. In one embodiment, the method may include forming an interconnect level above a semiconductor substrate and including a plurality of electrically conductive structures embedded in an interconnect dielectric material layer. A first interlayer dielectric (ILD) material layer is then formed above the interconnect level. Next, a metal-insulator-metal (MIM) capacitor is formed on the first ILD material layer, wherein the MIM capacitor includes a stack of a first electrode, a first capacitor dielectric material layer and a second electrode, and wherein an isolation element is located between segments of at least one of the first and second electrodes. A second interconnect dielectric (ILD) material layer is formed surrounding the MIM capacitor. Next, metal or metal alloy contact structures are formed in the second ILD material layer and contacting a surface of one of the electrically conductive structures present in the interconnect dielectric material layer.

DETAILED DESCRIPTION

Figure 1:
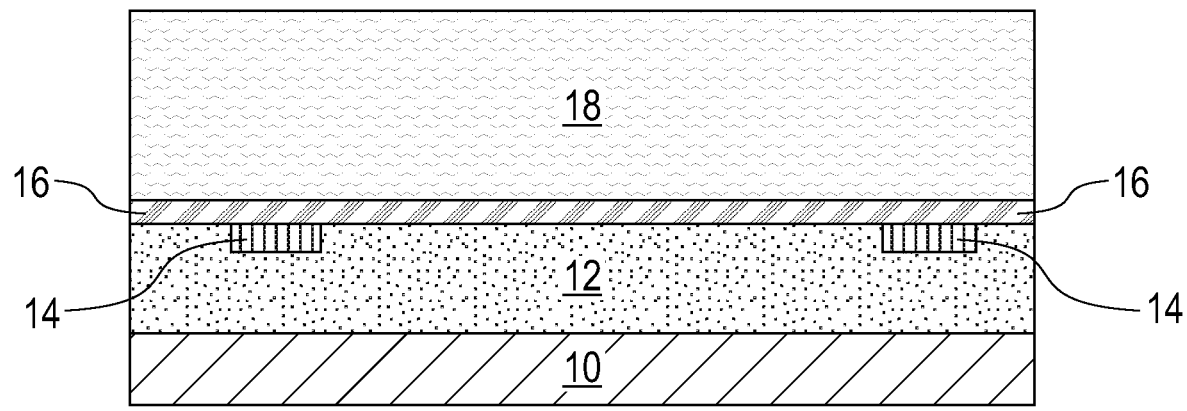
FIG. 1 is a cross sectional view of an exemplary integrated circuit (IC) chip of the present application and during an early stage of fabrication, wherein the IC chip includes a semiconductor substrate, an interconnect level including electrically conductive structures embedded in an interconnect dielectric material layer, a dielectric capping layer, and a first interlayer dielectric (ILD) material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary integrated circuit (IC) chip of the present application during an early stage of fabrication. The exemplary IC chip of FIG. 1 includes a semiconductor substrate 10, an interconnect level including electrically conductive structures 14 embedded in an interconnect dielectric material layer 12, a dielectric capping layer 16, and a first interlayer dielectric (ILD) material layer 18. In some embodiments, dielectric capping layer 16 may be omitted. Although the present application describes and illustrates a single interconnect level, the present application contemplates embodiments in which a plurality of interconnect levels are formed one atop the other, wherein each interconnect level includes an interconnect dielectric material layer having a plurality of electrically conductive structures embedded therein.

The semiconductor substrate 10 that may be employed in the present application includes at least one semiconductor material having semiconducting properties. Examples of semiconductor materials that can be employed include, for example, silicon (Si), germanium (Ge), a silicon germanium (SiGe) alloy, silicon carbide (SiC), silicon germanium carbide (SiGeC), a III-V compound semiconductor or a II-VI compound semiconductor. The semiconductor substrate may be a bulk semiconductor substrate or a semiconductor-on-insulator (SOI) substrate. A bulk semiconductor substrate is composed entirely of at least one semiconductor material, while an SOI substrate includes an insulator layer (such as, for example, silicon dioxide and/or boron nitride) located between a topmost semiconductor material and a handle substrate; the handle substrate is typically composed of a semiconductor material as well.

Although not illustrated in the drawings of the present application, one or more semiconductor devices may be disposed on, and/or within, a surface of the semiconductor substrate 10. The one or more semiconductor devices may include, for example, transistors, capacitors and/or diodes. The one or more semiconductor devices may be formed utilizing techniques well known to those skilled in the art.

The interconnect dielectric material layer 12 may be composed of an inorganic dielectric material or an organic dielectric material. In some embodiments, the interconnect dielectric material layer 12 may be porous. In other embodiments, the interconnect dielectric material layer 12 may be non-porous. Examples of suitable dielectric materials that may be employed as the interconnect dielectric material layer 12 include, but are limited to, silicon dioxide, undoped or doped silicate glass, silsesquioxanes, C doped oxides (i.e., organosilicates) that include atoms of Si, C, O and H, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The interconnect dielectric material layer 12 may have a dielectric constant (all dielectric constants mentioned herein are measured relative to a vacuum, unless otherwise stated) that is about 4.0 or less. In one embodiment, the interconnect dielectric material layer 12 has a dielectric constant of 2.8 or less. These dielectrics generally having a lower parasitic cross talk as compared to dielectric materials whose dielectric constant is greater than 4.0.

The interconnect dielectric material layer 12 may be formed by a deposition process such as, for example, chemical vapor deposition (CVD), plasma enhanced chemical vapor deposition (PECVD) or spin-on coating. The interconnect dielectric material layer 12 may have a thickness from 50 nm to 250 nm. Other thicknesses that are lesser than 50 nm, and greater than 250 nm can also be employed in the present application.

Electrically conductive structures 14 are then formed into the interconnect dielectric material layer 12. The electrically conductive structures 14 have a topmost surface that is coplanar with a topmost surface of the interconnect dielectric material layer 12. The electrically conductive structures 14 may extend throughout the entire thickness of the interconnect dielectric material layer 12 and contact a surface of the one or more semiconductor devices. For example, and when transistors are used as the one or more semiconductor devices, the electrically conductive structures 14 may contact a surface of each source/drain region and/or a surface of the gate electrode.

The electrically conductive structures 14 may be formed by providing openings (not shown) in the interconnect dielectric material layer 12, and then filling the openings with an electrically conductive metal or metal alloy. The openings that are formed into the interconnect dielectric material layer 12 may be via openings, line openings and/or combined via/line openings. The openings may be formed by lithography and etching. In embodiments in which a combined via/line opening is formed, a second iteration of lithography and etching may be used to form such a combined via/line opening. After forming the openings, the openings are filled with an electrically conductive metal or metal alloy. Examples of electrically conductive metals include, for example, copper (Cu), aluminum (Al), tungsten (W), or cobalt (Co). An example of an electrically conductive metal alloy that can be used is a copper-aluminum alloy. The electrically conductive metal or metal alloy may be formed utilizing a deposition process such as, for example, CVD, PECVD, sputtering, chemical solution deposition or plating. In one embodiment, a bottom-up plating process can be employed in filling each opening. In some embodiments, a planarization process such as, for example, chemical mechanical polishing (CMP) may follow the deposition of the electrically conductive metal or metal alloy.

In embodiments in which dielectric capping layer 16 is present, the dielectric capping layer 16 can be formed on the physically exposed topmost surface of the interconnect level (12/14). The dielectric capping layer 16 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric material that provides the dielectric capping layer 16 may be formed utilizing a deposition process such as, for example, CVD, PECVD, atomic layer deposition (ALD), chemical solution deposition or evaporation. When present, dielectric capping layer 16 may have a thickness from 10 nm to 100 nm. Other thicknesses that are lesser than 10 nm, or greater than 100 nm may also be used as the thickness of the dielectric capping layer 16. The dielectric capping layer 16 is typically compositionally different from the interconnect dielectric material layer 12 and the first interlayer dielectric (ILD) material layer 18 to be subsequently formed.

The first ILD material layer 18 is then formed either on a physically exposed surface of the dielectric capping layer 16, or a physically exposed surface of the interconnect level (12/14). The first ILD material layer 18 may include one of the dielectric materials mentioned above for the interconnect dielectric material layer 12. In one embodiment, the first ILD material layer 18 may be composed of a same dielectric material as the interconnect dielectric material layer 12. In another embodiment, the first ILD material layer 18 may be composed of a different dielectric material than the interconnect dielectric material layer 12. The first ILD material layer 18 may be formed by a deposition process such as, for example, CVD, PECVD or spin-on coating. The first ILD material layer 18 may have a thickness from 50 nm to 250 nm. Other thicknesses that are lesser than 50 nm, and greater than 250 nm can also be employed in the present application. It is noted that first ILD material layer 18 and the second ILD material layer 36 to be formed in a later processing step of the present application, may collectively be referred to herein as a via ILD material which houses the MIM capacitor of the present application, as well as, the metal or metal alloy contact structures 36 (to be formed in a later processing step of the present application).

Figure 2:
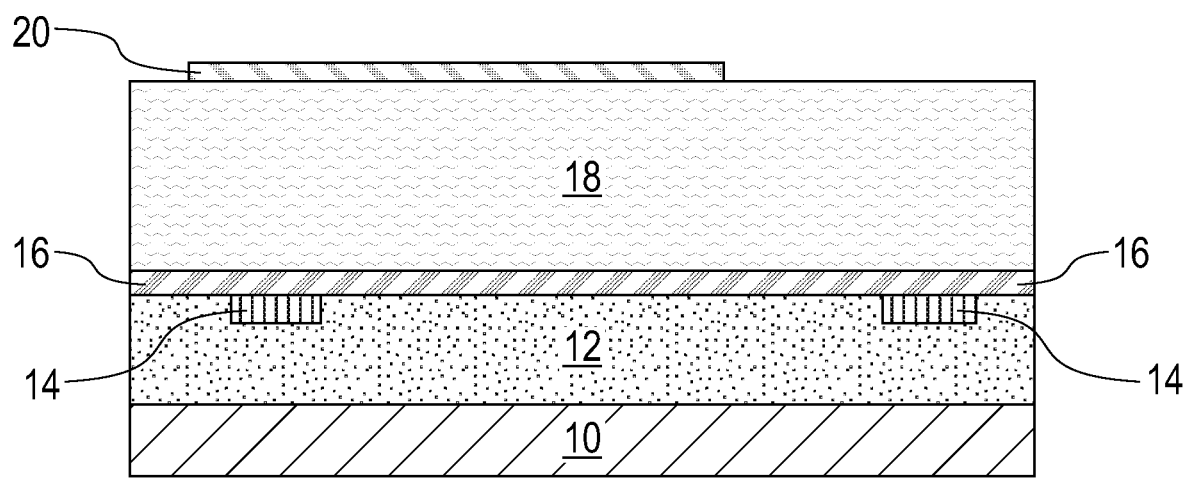
FIG. 2 is a cross sectional view of the exemplary IC chip of FIG. 1 after forming a first electrode of a metal-insulator-metal (MIM) capacitor.

Referring now to FIG. 2, there is illustrated the exemplary IC chip of FIG. 1 after forming a first electrode 20 of a metal-insulator-metal (MIM) capacitor of the present application. In the illustrated embodiment, the first electrode 20 is formed by providing a first electrode-containing material layer on a physically exposed surface of the first ILD material layer 18, and then patterning the first electrode-containing material layer by lithography and etching.

The first electrode-containing material layer that is used in providing the first electrode 20 may be composed of a conductive metal or conductive metal nitride. Exemplary conductive materials that may be used as the first electrode-containing material layer may include titanium (Ti), titanium nitride (TiN), tantalum (Ta), tantalum nitride (TaN), or copper (Cu). The first electrode-containing material layer can be formed utilizing a deposition process including, for example, CVD, PECVD, physical vapor deposition (PVD), ALD, sputtering, or other like deposition processes. The first electrode-containing material layer that is used in providing the first electrode 20 may have a thickness from 10 nm to 50 nm; although other thicknesses are contemplated and can be used in the present application.

Figure 3:
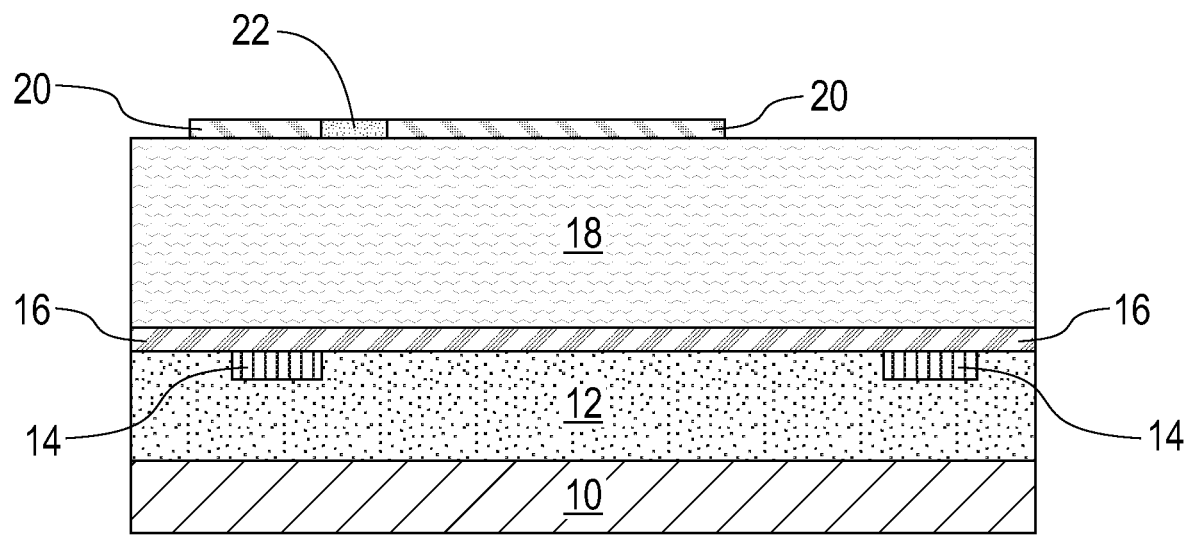
FIG. 3 is a cross sectional view of the exemplary IC chip of FIG. 2 after forming a first isolation element in contact with the first electrode.

Referring now to FIG. 3, there is illustrated the exemplary IC chip of FIG. 2 after forming a first isolation element 22 in contact with the first electrode 20. The term "isolation element" is used throughout the present application to denote a structure that is composed of a material that can be rendered highly resistive or electrically open when a high current passes therethrough thereby disconnecting the MIM capacitor or electrode plate from the active circuitry.

In this embodiment, the first isolation element 22 is formed between segments of the first electrode 20. Notably, the first electrode 20 is patterned by lithography and etching to provide an opening in between patterned portions (i.e., remaining segments) of the first electrode 20. Next, the first isolation element 22 is formed into the opening to provide the embodiment shown in FIG. 3. The forming of the first isolation element 22 may include a deposition process, followed by a planarization process. In this embodiment, the first isolation element 22 is located entirely between segments of the first electrode 20, and the first isolation element 22 has a topmost surface that is coplanar with a topmost surface of the first electrode 20.

In one embodiment, the first isolation element 22 is composed of a phase change material that is conducting at a first temperature (i.e., low resistance), and becomes insulating at a second temperature that is higher than the first temperature (i.e., high resistance). The first isolation element 22 that is composed of such a phase change material is referred to as a "metal-to-insulator (MIT)" phase change material. In one example, MIT phase change material may be conducting up to a temperature of 150° C. (i.e., first temperature and then it can be converted into an insulating material above 200° C. (i.e., second temperature). The MIT phase change material may be composed of a transition metal oxide such as, for example, $Ti_{2-x}V_xO_3$ wherein x is from 0.01 to 0.05.

The MIT phase change material that provides the first isolation element 22 may have a thickness from 3 nm to 100 nm; although other thicknesses for the MIT phase change material are contemplated and can be employed in the present application. The MIT phase change material can be formed by a deposition process including, for example, CVD, PECVD, ALD, PVD, sputtering, chemical solution deposition or plating.

In some embodiments, a fuse material may be used as the first isolation element 22. In such an embodiment, the passing of a high current through the first material opens the circuit by blowing the first isolation element 12. Examples of fuse materials that can be employed in the present application include TiN, TaN, RuTaN, IrTaN or polysilicon; the fuse material is compositionally different from the electrode. The fuse material that provides the first isolation element 22 may have a thickness from 3 nm to 100 nm; although other thicknesses for the fuse material are contemplated and can be employed in the present application. The fuse material can be formed by a deposition process including, for example, CVD, PECVD, ALD, PVD, sputtering, chemical solution deposition or plating.

Figure 4:
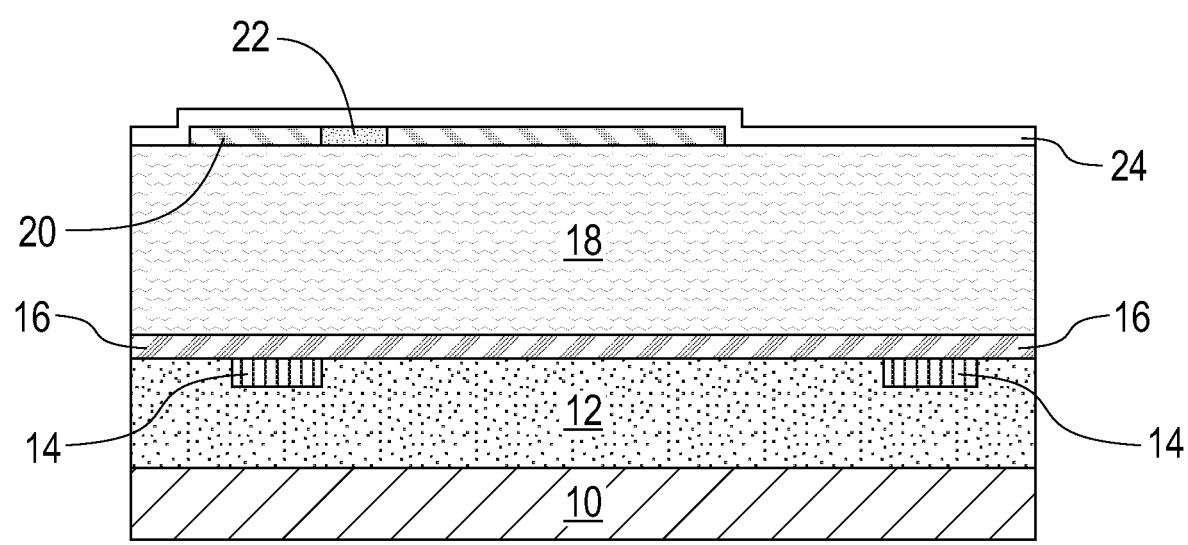
FIG. 4 is a cross sectional view of the exemplary IC chip of FIG. 3 after forming a first capacitor dielectric material layer on the first isolation element and the first electrode.

Referring now to FIG. 4, there is illustrated the exemplary IC chip of FIG. 3 after forming a first capacitor dielectric material layer 24 on the first isolation element 22 and the first electrode 20; the first capacitor dielectric material layer 24 is a continuous layer and thus it is also formed on any exposed surface of the underlying first ILD material layer 18. The first capacitor dielectric material layer 24 may include a dielectric oxide, a dielectric nitride, a dielectric oxynitride, or a composite stack layer thereof. In one example, the first capacitor dielectric material layer 24 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered dielectric structure comprising different dielectric materials, e.g., silicon dioxide, and a high-k dielectric, can be formed and used as the first capacitor dielectric material layer 24.

The first capacitor dielectric material layer 24 can be formed by any deposition process including, for example, CVD, PECVD, PVD, ALD or sputtering. In one embodiment of the present application, the dielectric material used in providing the first capacitor dielectric material layer 24 can have a thickness in a range from 1 nm to 10 nm. Other thicknesses that are lesser than, or greater than, the aforementioned thickness range can also be employed for the dielectric material that may provide the first capacitor dielectric material layer 24.

Figure 5:
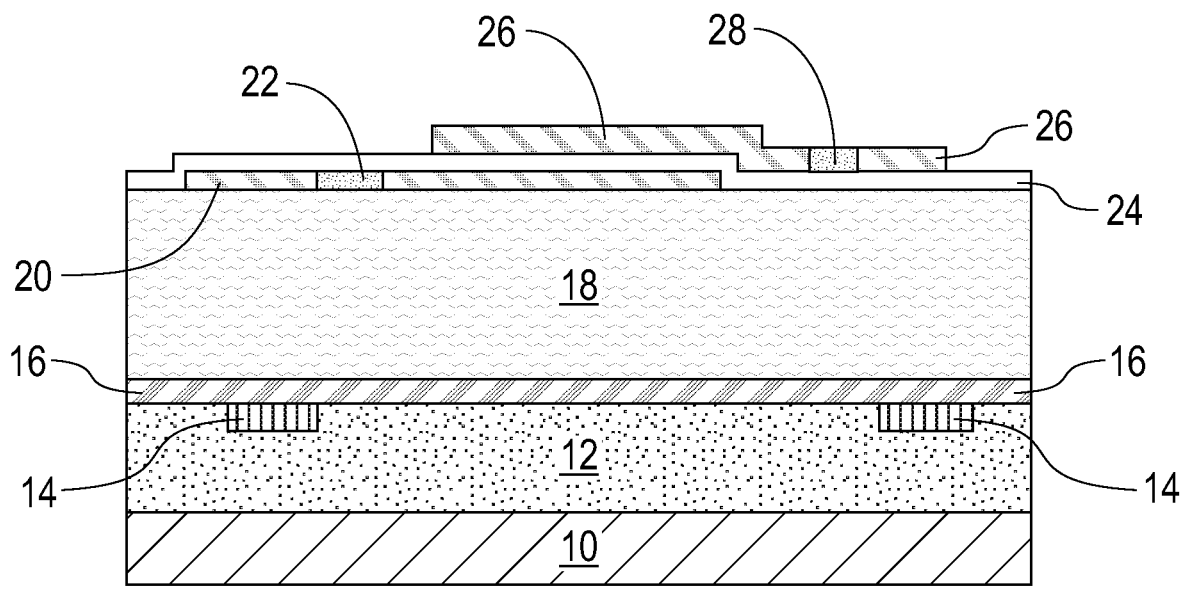
FIG. 5 is a cross sectional view of the exemplary IC chip of FIG. 4 after forming a second isolation element in contact with a second electrode.

Referring now to FIG. 5, there is illustrated the exemplary IC chip of FIG. 4 after forming a second isolation element 28 in contact with a second electrode 26; i.e., the second isolation element 28 is in contact with segments of the second electrode 26. In the illustrated embodiment, the second electrode 26 is formed first utilizing the technique mentioned above in forming the first electrode 20, and thereafter the second isolation element 28 is formed utilizing the technique mentioned above in forming the first isolation element 22.

Notably, the second electrode 26 is formed by providing a second electrode-containing material layer on a physically exposed surface of the first capacitor dielectric material layer 24, and then patterning the second electrode-containing material layer by lithography and etching. The second electrode-containing material layer that is used in providing the second electrode 26 may be composed of one of the conductive metals or conductive metal nitrides mentioned above for the first electrode-containing material layer. In one embodiment, the second electrode-containing material layer that provides the second electrode 26 is composed of a same conductive material as the first electrode-containing material layer that provides the first electrode 20. In another embodiment, the second electrode-containing material layer that provides the second electrode 26 is composed of a different conductive material than the first electrode-containing material layer that provides the first electrode 20. The second electrode-containing material layer that is used in providing the second electrode 26 may have a thickness from 10 nm to 50 nm; although other thicknesses are contemplated and can be used in the present application.

Next, the second isolation element 28 is formed in contact with a surface of the second electrode 26 utilizing the technique mentioned above in forming the first isolation element 22. The second isolation element 28 may be composed of one of the materials mentioned above for providing the first isolation element 22. In one embodiment, the second isolation element 28 is composed of a same material as the first isolation element 22. In another embodiment, the second isolation element 28 is composed of a different material than the first isolation element 22.

Figure 6:
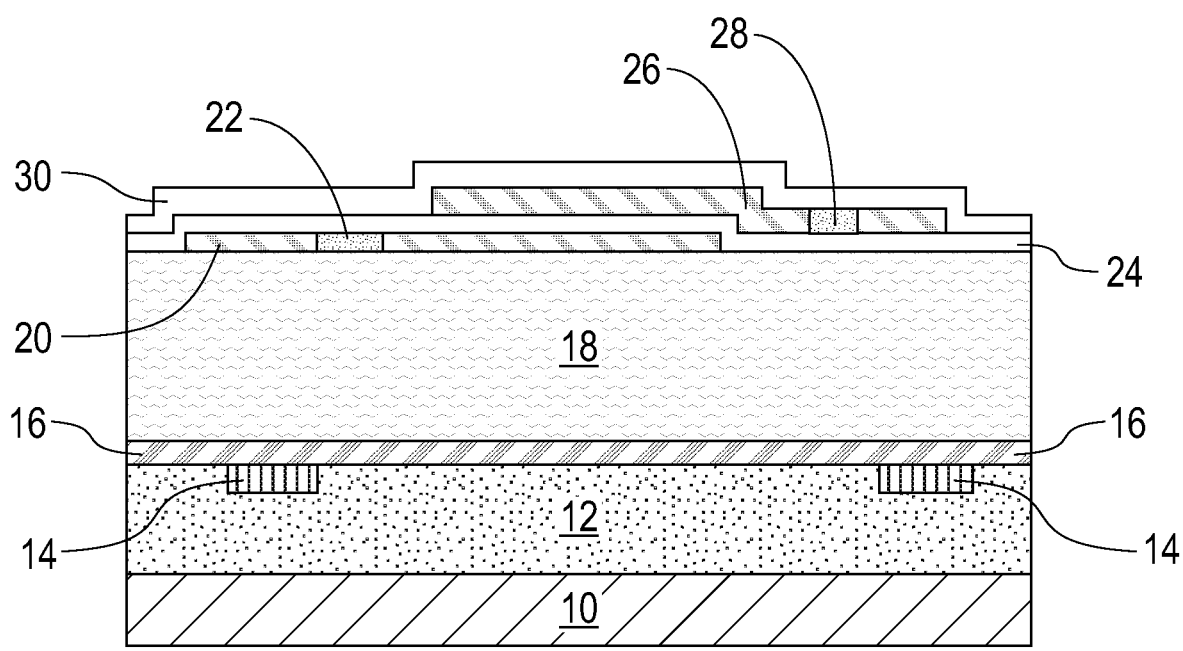
FIG. 6 is a cross sectional view of the exemplary IC chip of FIG. 7 after forming a second capacitor dielectric material layer on the second isolation element and the second electrode.
Figure 7:
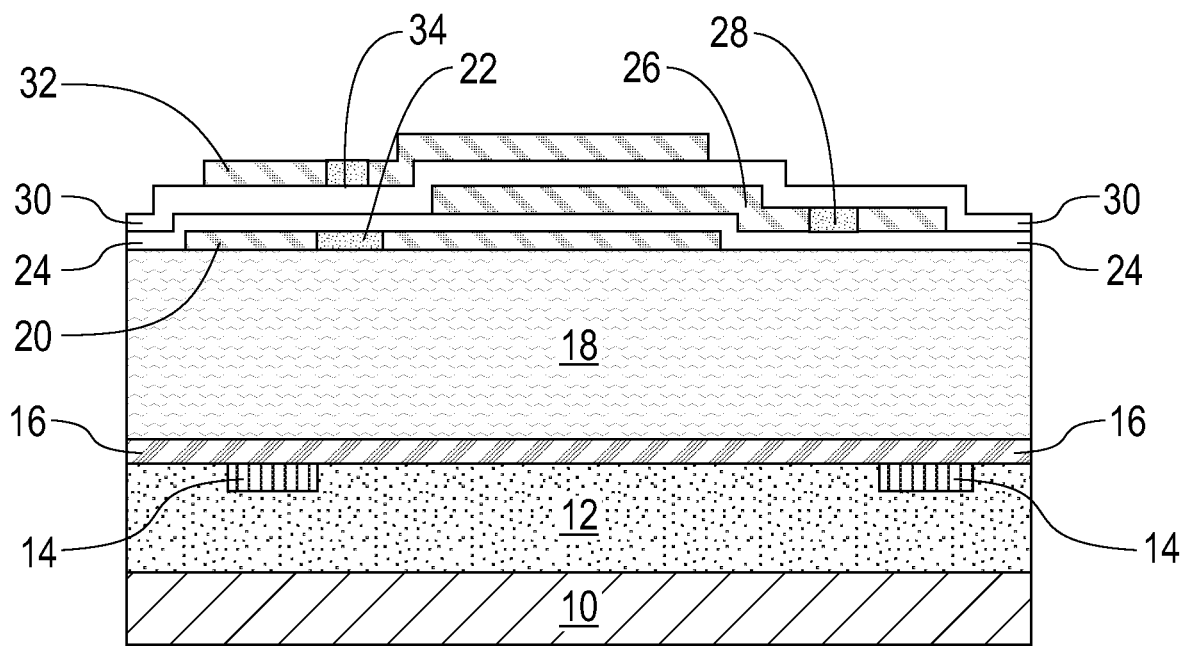
FIG. 7 is a cross sectional view of the exemplary IC chip of FIG. 6 after forming a third isolation element in contact with a third electrode.

Referring now to FIG. 6, there is illustrated the exemplary IC chip of FIG. 7 after forming a second capacitor dielectric material layer 30 on the second isolation element 28 and the second electrode 26; the second capacitor dielectric material layer 30 is a continuous layer thus it also present on any exposed surface of the first capacitor dielectric material 24.

The second capacitor dielectric material layer 30 can be composed of one of the dielectric materials mentioned above for the first capacitor dielectric material layer 24. In one embodiment, the second capacitor dielectric material layer 30 is composed of a same dielectric material as the first capacitor dielectric material layer 24. In another embodiment, the second capacitor dielectric material layer 30 is composed of a different dielectric material than the first capacitor dielectric material layer 24. The second capacitor dielectric material layer 30 may be formed utilizing one of the deposition processes mentioned above for providing the first capacitor dielectric material layer 26. Also, the second capacitor dielectric material layer 30 may have a thickness within the range mentioned above for the first capacitor dielectric material layer 26.

Referring now to FIG. 7, there is illustrated the exemplary IC chip of FIG. 6 after forming a third isolation element 34 in contact with a third electrode 32; i.e., the third isolation element 34 contacts segments of the third electrode 32. In the illustrated embodiment, the third electrode 32 is formed first utilizing the technique mentioned above in forming the first electrode 20, and thereafter the third isolation element 34 is formed utilizing the technique mentioned above in forming the first isolation element 22.

Notably, the third electrode 32 is formed by providing a third electrode-containing material layer on a physically exposed surface of the second capacitor dielectric material layer 30, and then patterning the third electrode-containing material layer by lithography and etching. The third electrode-containing material layer that is used in providing the third electrode 32 may be composed of one of the conductive metals or conductive metal nitrides mentioned above for the first electrode-containing material layer. In one embodiment, the third electrode-containing material layer that provides the third electrode 32 is composed of a same conductive material as the first electrode-containing material layer that provides the first electrode 20 and/or the second electrode-containing material layer that provides the second electrode 26. In another embodiment, the third electrode-containing material layer that provides the third electrode 32 is composed of a different conductive material than the first electrode-containing material layer that provides the first electrode 20 and/or the second electrode-containing material layer that provides the second electrode 26. The third electrode-containing material layer that is used in providing the third electrode 32 may have a thickness from 10 nm to 50 nm; although other thicknesses are contemplated and can be used in the present application.

Next, the third isolation element 34 is formed in contact with segments of the third electrode 32 utilizing the technique mentioned above in forming the first isolation element 22. The third isolation element 34 may be composed of one of the materials mentioned above for providing the first isolation element 22. In one embodiment, the third isolation element 34 is composed of a same material as the first isolation element 22 and/or the second isolation element 28. In another embodiment, the third isolation element 34 is composed of a different material than the first isolation element 22 and/or the second isolation element 28.

In the illustrated embodiment, elements 20/22/24/26/28/30/32/34 collectively provide a MIM capacitor that contains three planar electrodes (20/26/32) in which a capacitor dielectric (24/30) is located between each of the electrodes (20/26/32). Although a three electrode MIM capacitor is described and illustrated, a MIM capacitor including only two electrodes or more than three electrodes can be formed. As is known to those skilled in the art, a capacitor dielectric material layer would be present between each electrode of the MIM capacitor.

Also, and in this embodiment, each electrode (20/26/32) includes an isolation element (22/28/34). In some embodiments, the isolation element may be present only on some of the electrodes. For example, an isolation element may be present on the first electrode 20 and the third electrode 32, but not the second electrode 26. Alternatively, an isolation element may be present on the second and third electrodes, but not the first electrode. Other variations are possible as long as other at least one of the electrodes of the MIM capacitor includes an isolation element as defined herein.

Figure 8:
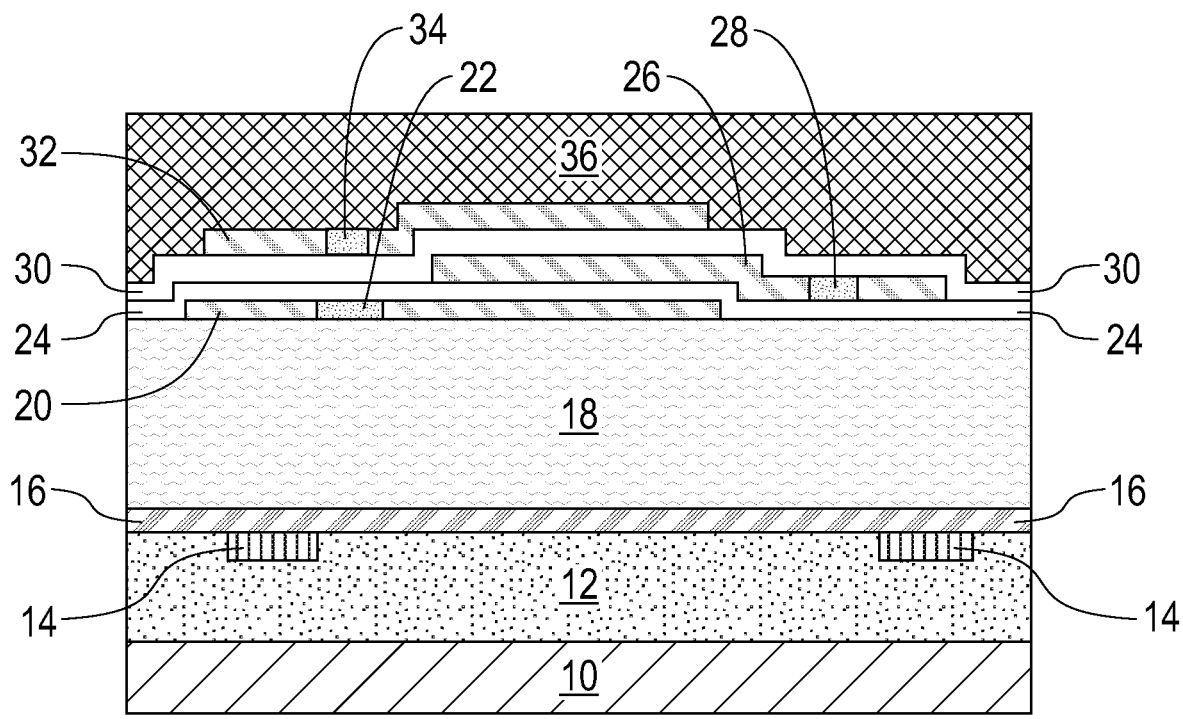
FIG. 8 is a cross sectional view of the exemplary IC chip of FIG. 7 after forming a second interconnect dielectric (ILD) material layer.

Referring now to FIG. 8, there is illustrated the exemplary IC chip of FIG. 7 after forming a second interconnect dielectric (ILD) material layer 36. The second ILD material layer 36 may include one of the dielectric materials mentioned above for the first ILD material layer 18. In one embodiment, the second ILD material layer 36 may be composed of a same dielectric material as the first ILD material layer 18. In one embodiment, the second ILD material layer 36 may be composed of a same dielectric material as the first ILD material layer 18. The second ILD material layer 36 may be formed utilizing one of the deposition techniques mentioned above for forming the first ILD material layer 18. The second ILD material layer 36 may have a thickness within the thickness range mentioned above for the first ILD material layer 18 as long as thickness of the second ILD material is sufficient to cover the entirety of the MIM capacitor.

Figure 9:
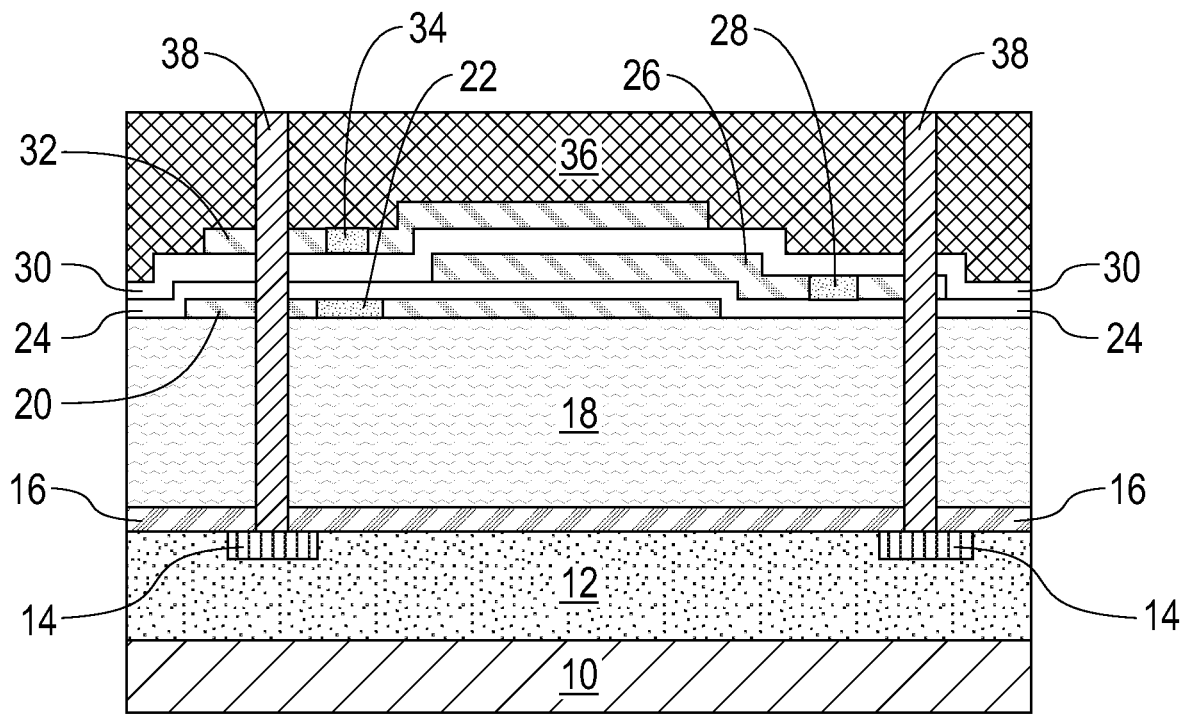
FIG. 9 is a cross sectional view of the exemplary IC chip of FIG. 8 after forming metal or metal alloy contact structures.

Referring now to FIG. 9, there is illustrated exemplary IC chip of FIG. 8 after forming metal or metal alloy contact structures 38. Each metal or metal alloy contact structure 38 that is formed extend down to a surface of one of the underlying electrically conductive structures 14. Each metal or metal alloy contact structure 38 has a topmost surface that is typically coplanar with a topmost surface of the second ILD material layer 36.

The metal or metal alloy contact structures 38 can be formed forming contacting openings with the second ILD material 24, the MIM capacitor, the first ILD material layer 18 and, if present, the dielectric capping layer stopping on a surface of the electrically conductive structures 14, and then filling each opening with a contact metal or metal alloy. The contact metal or metal alloy that provides each metal or metal alloy contact structures 38 may include one of the conductive materials mentioned above for the electrically conductive structures 14. In one embodiment, the metal or metal alloy contact structures 38 may be composed of a same conductive material as the electrically conductive structures 14. In another embodiment, the metal or metal alloy contact structures 38 may be composed of different conductive material than the electrically conductive structures 14. The filling of the contact openings may include one of the deposition techniques mentioned above in forming the electrically conductive structures 14. A planarization process may follow the deposition of the contact metal or metal alloy that provides the metal or metal alloy contact structures 38. In some embodiments, the metal or metal alloy contact structures 38 have vertical sidewalls that are essentially perpendicular to (90°±2°) a topmost surface of the semiconductor substrate 10. In other embodiments, the metal or metal alloy contact structures 38 may have tapered sidewalls such that the width of the metal or metal alloy contact structures 38 decreased from top to bottom.

Although the illustrated embodiment depicts a single damascene metal or metal alloy contact 38, dual damascene metal or metal alloy contact structures can also be employed in the present application.

Notably, FIG. 9 illustrates an exemplary IC chip of the present application. The IC chip includes an interconnect level (12/14) comprising a plurality of electrically conductive structures 14 embedded in an interconnect dielectric material layer 12. A via interlayer dielectric (ILD) material (18/36) is located above the interconnect level (12/14). A metal-insulator-metal (MIM) capacitor is embedded in the via ILD material (18/36) and includes a stack of a first electrode 20, a first capacitor dielectric material layer 24 and a second electrode 26, wherein an isolation element (22/28) is located between segments of at least one of the first and second electrodes (20/26). Metal or metal alloy contact structures 38 are located in the via ILD material (18/36), wherein each metal or metal alloy contact structure 38 extends to a surface of one of the electrically conductive structures 14 present in the interconnect dielectric material layer 12.

Figure 10A:
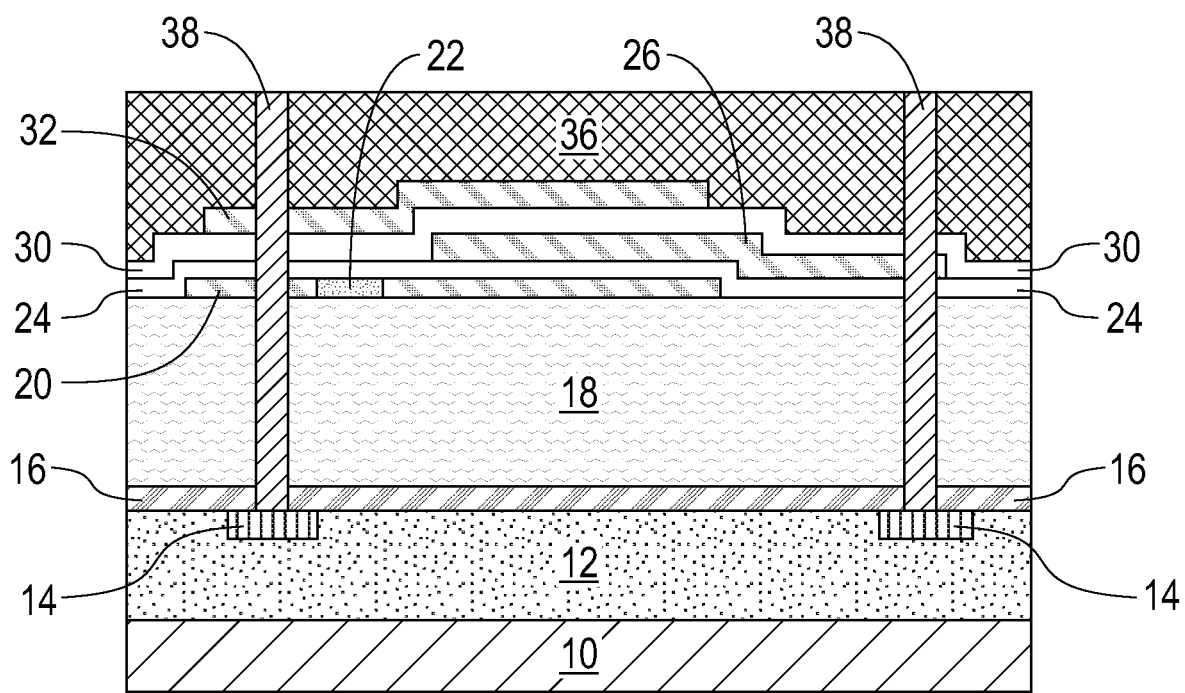
FIGS. 10A-10B are cross sectional views of other exemplary IC chips of the present application in which an isolation element is formed in contact with a given electrode of the MIM capacitor.
Figure 10B:
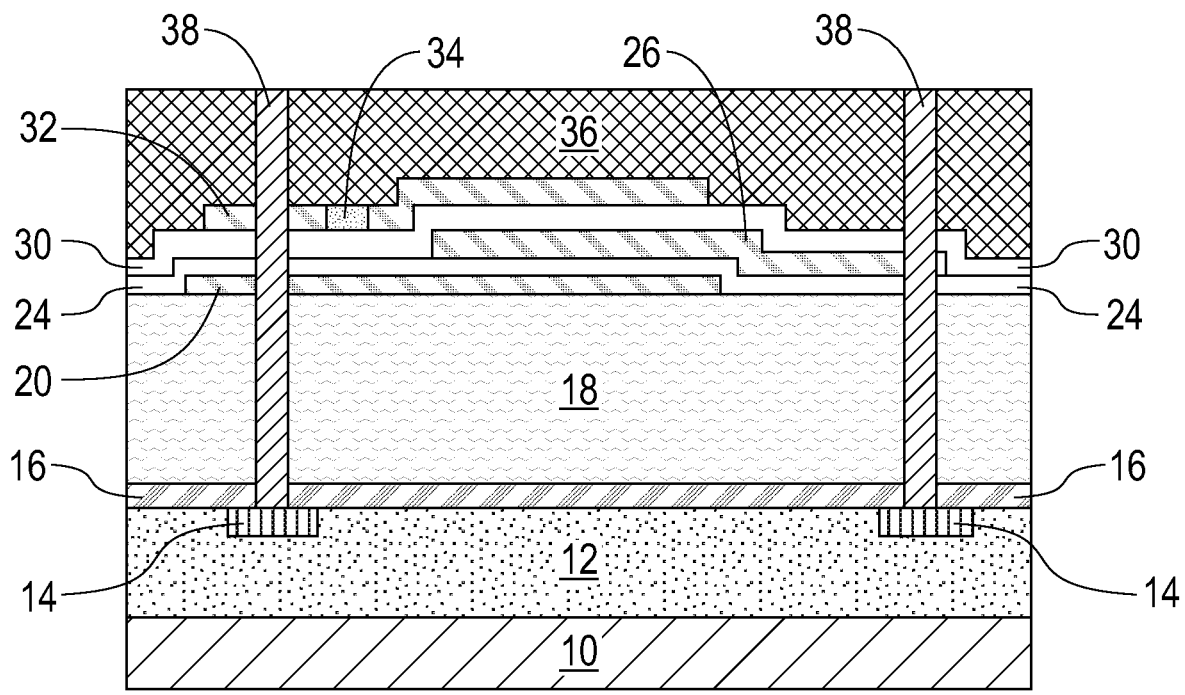

Referring now to FIGS. 10A-10B, there are illustrated IC chips of the present application in which an isolation element is formed in contact with a given electrode of the MIM capacitor. In the illustrated embodiment of FIG. 10A, isolation element 22 is formed in contact with the first electrode 20 of the MIM capacitor, while in FIG. 10B isolation element 34 is formed in contact with utilizing the third electrode 32. FIGS. 10A-10B show embodiments in which a given electrode in a MIM capacitor can be isolated, rather than completely isolating the entire MIM capacitor as is the case shown in FIG. 9.

Figure 11A:
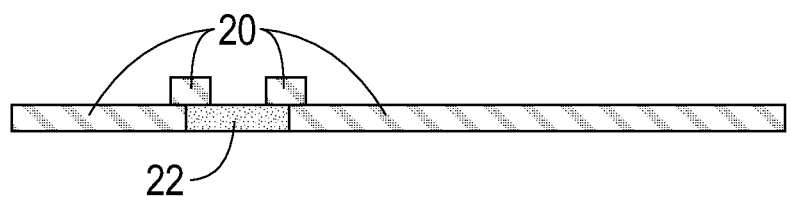
FIG. 11A is a cross sectional view illustrating an alternative design for the first isolation element and first electrode.
Figure 11B:
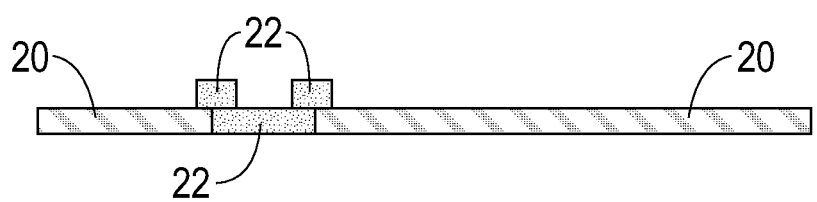
FIG. 11B is a cross sectional view illustrating another alternative design for the first isolation element and first electrode.

Referring now to FIGS. 11A-11B, there are illustrated alternative designs for the first isolation element 22 and first electrode 20. These alternative designs may apply to other electrode/isolation element combinations in the MIM capacitor. The alternative design shown in FIG. 11A can be formed by first providing the first isolation element 22 and then providing a first electrode 20. The alternative design shown in FIG. 11B can be formed by first providing the first electrode 20, forming an opening in the first electrode 20, and then forming the first isolation element 22 by lithography and etching. In FIG. 11B, the first isolation element 22 extends onto a topmost surface of segments of the first electrode 20.

In one embodiment, an isolation element such as, for example, a fuse, or a phase change material segment of a metal/insulation transition metal material is placed in series between the MIM capacitor and the active circuit. When a high current passes through the element due to the MIM capacitor being defective, the isolation element is rendered highly resistive or electrically open thereby disconnecting the defective capacitor or electrode plate from the active circuitry.

Figure 12A:
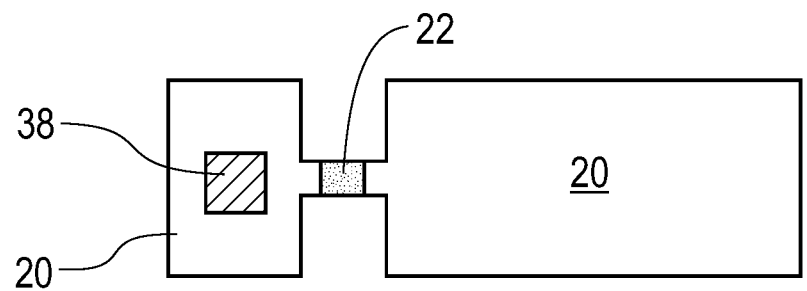
FIGS. 12A-12B are top down views illustrating other exemplary IC chips of the present application including an isolation structure in the necking region of one of the electrodes of the MIM capacitor.
Figure 12B:
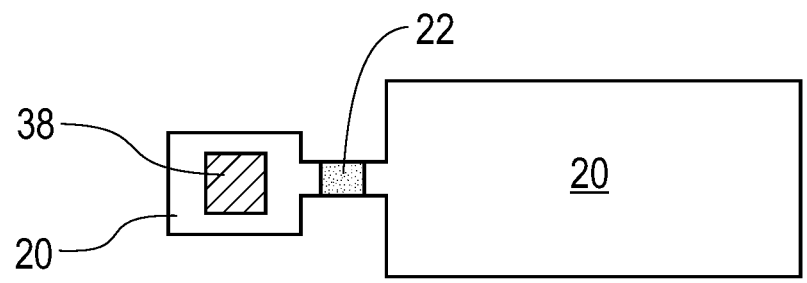

Referring now to FIGS. 12A-12B, there are illustrated other exemplary IC chips of the present application including an isolation structure in the necking region of one of the electrodes of the MIM capacitor (in these drawings only the bottom electrode of the MIM capacitor is shown, for clarity and by way of one example). In the embodiments shown in FIGS. 12A-12B, at least one of the electrodes (e.g., the first electrode 22) can be thinned in one region to provide a thinned region, i.e., necking region, that is located between two thicker end portions of the electrode(s). By placing the isolation element (e.g., first isolation element 22) in the necking region of the electrode, the sensitivity of the electrode is increased. The necking will increase the leakage current density (for the same total leakage current) by 'concentrating' the leakage to a small area.

Figure 13:
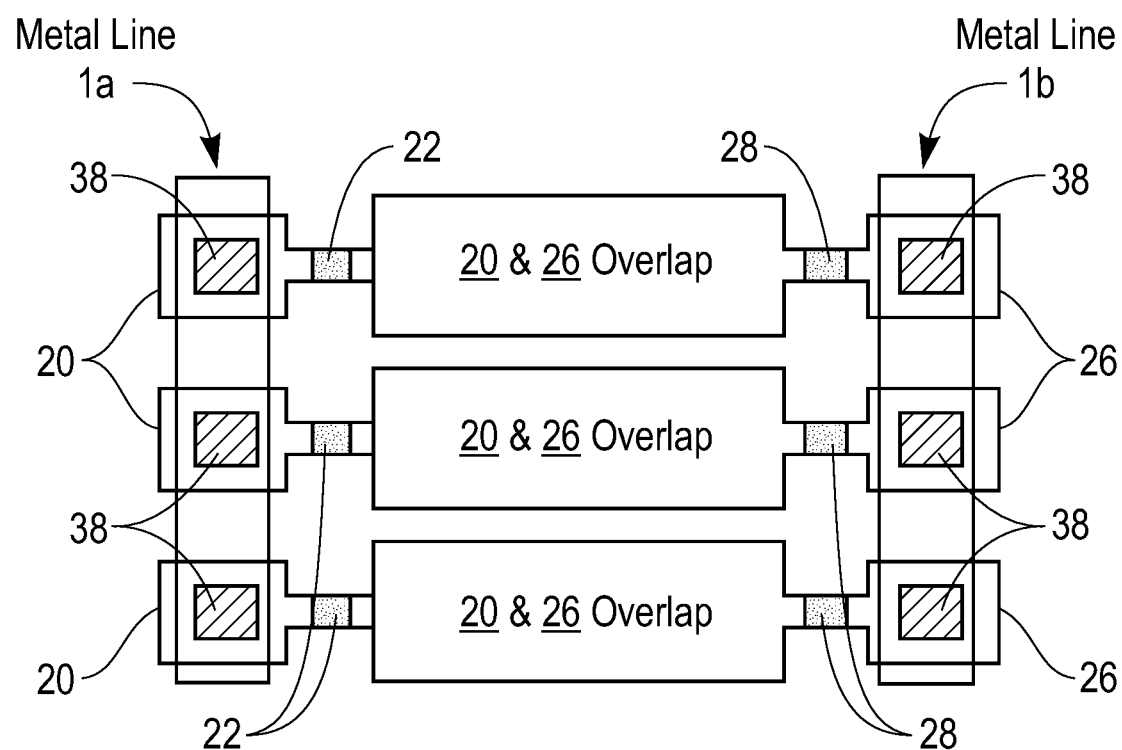
FIG. 13 is a top down view illustrating yet another IC chip of the present application including an array of MIM capacitors.

In another embodiment of the present application, a plurality of MIM capacitors (i.e., an array) including capacitor electrodes with isolation elements and capacitor dielectric layers can be formed laterally adjacent to the MIM capacitor shown in FIG. 9, FIG. 10A, FIG. 10B, FIG. 12A or FIG. 12B. In such an embodiment, the array enables isolates fractions of MIM capacitors with defect (shorting or high leakage) to improve the overall yield and lifetime. FIG. 13 illustrates an array of MIM capacitors in accordance with the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An integrated circuit chip comprising:
    an interconnect level comprising a plurality of electrically conductive structures embedded in an interconnect dielectric material layer;
    a via interlayer dielectric (ILD) material located above the interconnect level;
    a metal-insulator-metal (MIM) capacitor embedded in the via ILD material and comprising a stack of a first electrode, a first capacitor dielectric material layer and a second electrode, wherein an isolation element is located between segments of at least one of the first and second electrodes and wherein a portion of the isolation element is located directly on a topmost surface of the at least one of the first and second electrodes; and
    metal or metal alloy contact structures located in the via ILD material, wherein each metal or metal alloy contact structure extends to a surface of one of the electrically conductive structures present in the interconnect dielectric material layer.

2. The integrated circuit chip of claim 1, wherein the isolation element is composed of phase change material that is conducting at a first temperature and, becomes insulating at a second temperature that is higher than the first temperature.

3. The integrated circuit chip of claim 2, wherein the phase change material is a transition metal oxide.

4. The integrated circuit chip of claim 3, wherein the transition metal oxide is $Ti_{2-x}V_xO_3$ wherein x is from 0.01 to 0.05.

5. The integrated circuit chip of claim 1, wherein the isolation element is composed of a fuse material.

6. The integrated circuit chip of claim 5, wherein the fuse material is TiN, TaN, RuTaN, IrTaN or polysilicon.

7. The integrated circuit chip of claim 1, wherein a first isolation element is located between segments of the first electrode, and a second isolation element is located between segments of the second electrode.

8. The integrated circuit chip of claim 1, wherein the MIM capacitor further comprises a second capacitor dielectric material layer located on the second electrode, and a third electrode located on the second capacitor dielectric material layer, wherein the isolation element is located between segments of at least one of the first, second and third electrodes.

9. The integrated circuit chip of claim 8, wherein a first isolation element is located between segments of the first electrode, a second isolation element is located between segments of the second electrode, and a third isolation element is located between segments of the third electrode.

10. The integrated circuit chip of claim 8, wherein the isolation element is located between segments of the first electrode or the third electrode, but not the second electrode.

11. The integrated circuit chip of claim 1, wherein the isolation element is located in a necking region of one of the first and second electrodes.

* * * * *